United States Patent [19]
Iseki et al.

[11] Patent Number: 5,608,358
[45] Date of Patent: Mar. 4, 1997

[54] NON-LINEAR ELECTROCHEMICAL OSCILLATOR AND SENSOR USING THE SAME

[75] Inventors: Masahiro Iseki; Yukihiro Sugiyama, both of Tsukuba, Japan

[73] Assignee: Sanyo Electric Co., Ltd., Osaka, Japan

[21] Appl. No.: 534,568

[22] Filed: Sep. 27, 1995

[30] Foreign Application Priority Data

Sep. 30, 1994 [JP] Japan .................................. 6-235817
Jul. 14, 1995 [JP] Japan .................................. 7-178423

[51] Int. Cl.$^6$ .......................... H03B 28/00; G01N 27/26; G01N 27/333; G01N 27/40
[52] U.S. Cl. .......................... 331/65; 331/187; 73/53.01; 73/61.41; 204/194; 364/497
[58] Field of Search ............................. 331/65, 74, 187; 73/61.41, 61.45, 61.49, 61.75, 64.53, 53.01; 204/193, 194; 364/497, 498, 499

[56] References Cited

U.S. PATENT DOCUMENTS

| | | | |
|---|---|---|---|
| 4,317,705 | 3/1982 | Hamada et al. | 204/1 T |
| 5,198,988 | 3/1993 | Dorr et al. | 364/497 |
| 5,280,424 | 1/1994 | Rony et al. | 364/148 |

OTHER PUBLICATIONS

M. Iseki et al., 1994 *Electrical Oscillations Caused by Donor and Acceptor in Polypyrrole-Polycarbonate Composite Membrane*, Tsukuba Research Center, NIMC-AIST, Japan, Mar. 22–25; pp. 67–68.

Jan Kotowski, et al., "Electrical oscillations in polypyrrole-lecithin bilayer lipid membranes", Bioelectrochemistry and Bioenergetics, 19 (1988) 283–289. J. Electroanal. Chem. No Month vol. 253, pp. 283–289.

Masahiro Iseki, et al. , "Electrical oscillations across polypyrrole membranes caused by electron donors and electron acceptors", Bioelectrochemistry and Bioenergetics, 34 (1994), pp. 149–152. No Month.

*Primary Examiner*—David Mis
*Attorney, Agent, or Firm*—Loeb & Loeb LLP

[57] ABSTRACT

To obtain a stable non-linear oscillator using polypyrrole, KCl liquid electrolyte is separated with a working electrode 14 provided with a polypyrrole film 14a. A counter electrode 16 is provided on one of the separated portions of the liquid electrolyte, and a reference electrode 12 is provided in the other separated liquid electrode portion. The counter electrode 16, working electrode 14 and reference electrode 12 are connected to a potentiostat 10. The potential on the working electrode 14 is set to be between the oxidizing and reducing potentials of polypyrrole. With oxidizing or reducing reaction of polypyrrole, an ion concentration gradient is produced in the liquid electrolyte across polypyrrole film to change the potentials on the reference and working electrodes 12 and 14, thus causing an oscillating current between the working and counter electrodes 14 and 16.

12 Claims, 9 Drawing Sheets

Fig. 1(A)
| NON-LINEAR OSCILLATOR | WAVE-FORM | SENSITIVE SUBSTANCE | |
|---|---|---|---|
| ① | ~ | A | B |
| ② | ∿ | | B |
| ③ | ⋀⋀⋀ | A | C |
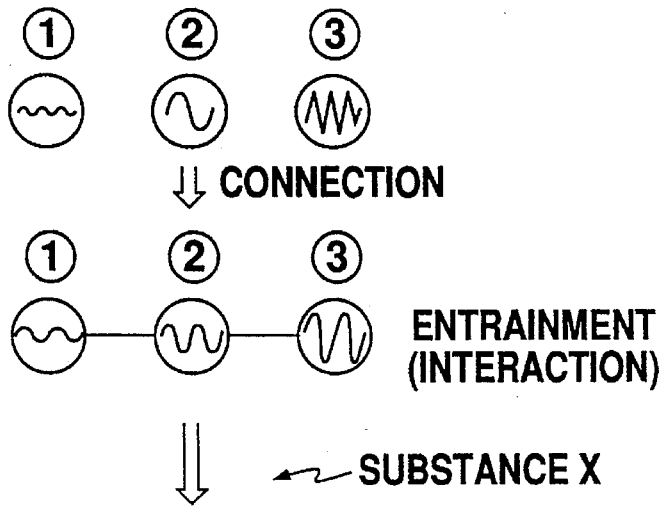
Fig. 1(B)
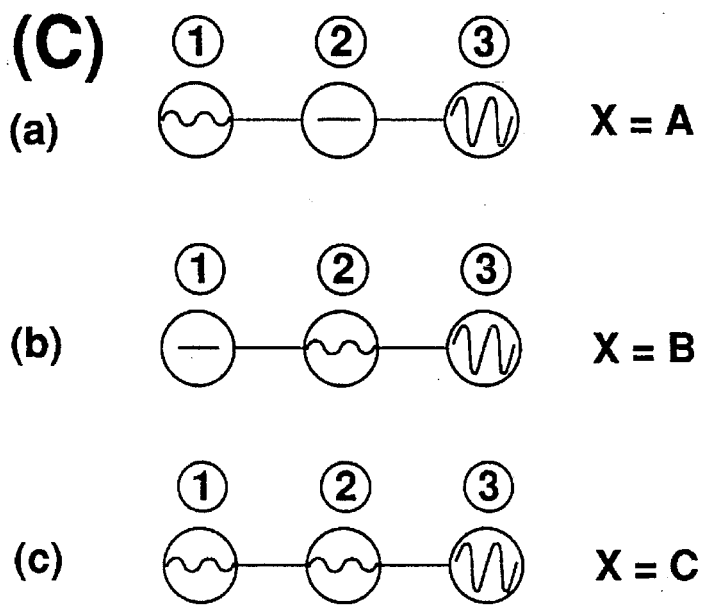
Fig. 1(C)

NON-LINEAR ELECTROCHEMICAL OSCILLATOR AND SENSOR USING THE SAME

BACKGROUND OF THE INVENTION

1. Field of the Invention

This invention relates to non-linear oscillator using electronically conducting polymer films and sensor employing such oscillators.

2. Description of the Related Art

Recently, the role of non-linear oscillators in information processing mechanisms of organisms has been attracting attention. The inventors conducted biological information processing research and investigations using slugs and clearly that non-linear oscillations of local field potentials in procerebral lobe are closely related to the learning and memory of odor information. When applications of the phenomenon of non-linear oscillations (to biological sensors, for instance) is considered, it is most important to develop a stable non-linear oscillator. However, well-known non-linear oscillations such as those of BZ reaction, oil-water interface reaction, phase transition reaction of lipids, etc. are basically produced under non-equilibrium systems by mass transport. Therefore, it is inherently difficult to obtain stable oscillations, and applications thereof are limited.

Meanwhile, there has been recent research concerning polypyrrole and similar conducting polymers capable of oxidation and reduction and having ion selectivity, and applications of such polymers using special film properties thereof have been investigated. Kotowski et al. reports (J. Kotowski, T. Janas and H. T. Tien, Bioelectrochem. Bioenerg., 19(1988)283) that interesting electrical oscillations were obtained in composite membrane systems of bilayer membranes comprising polypyrrole and lipid. With this report as a reference, the inventors conducted research and investigations with the aim of obtaining stable electric oscillations with films of only polypyrrole to obtain aperiodic membrane potential oscillations via a polypyrrole only film (M. Iseki, M. Ikematsu, Y. Sugiyama and A. Mizukami, Bioelectrichem. Bioenerg., 34(1994)149).

SUMMARY OF THE INVENTION

The present invention was made under the background circumstances as described above.

An object of the invention is to realize stable non-linear oscillation in a non-equilibrium system of stable electric energy rather than mass transport energy, by constructing a quite novel electrochemical oscillating system simulating a biological system, specifically by using polypyrrole or similar conducting polymer capable of electrochemical oxidation and reduction as noted above.

Another object of the invention is to provide a sensor employing such an electrochemical oscillating system.
(Novel Electrochemical Oscillating System Simulating a Biological System)

According to the invention, unlike prior art oscillations in non-equilibrium systems, semi-permanent oscillation is provided by making deft use of the character of conducting polymers which are capable of oxidation and reduction and have ion selectivity.

Specifically, an electrolyte is separated by a separating film of a conducting polymer formed on a working electrode, and an electrochemical reaction is brought about between the working electrode and a counter electrode disposed in one of the separated portions of the electrolyte, by setting the potential on the working electrode to an intermediate value between the oxidation potential and reduction potential of the conducting polymer. A reference electrode is disposed in the other separated portion of the electrolyte, and the potential between the working electrode and reference electrode are held constant. In general electrochemical system, a working electrode, a counter electrode and a reference electrode are disposed in an electrolyte for determining the electrochemical property of a substance by maintaining a constant potential difference between the reference electrode and the working electrode using a potentiostat. According to the invention, it is important that the three electrodes are not disposed in the same electrolyte, but that the electrolyte is separated by a conducting polymer.

More specifically, a non-linear oscillator according to one aspect of the invention comprises a working electrode having a conducting polymer, which separates an electrolyte and is capable of electrochemical oxidation and reduction, a counter electrode provided in one of the separated portions of electrolyte, a reference electrode provided in the other separated portion of electrolyte, potential control means for maintaining a constant potential difference between the reference electrode and the working electrode, and output means for causing a current to flow between the counter electrode and the working electrode, where the potential on the working electrode is set to an intermediate value between the oxidation potential and reduction potential of the conducting polymer.

In the non-linear oscillator having the above structure according to the invention, the conducting polymer having ion selectivity does not allow free transfer of ions through it, and as the conducting polymer undergoes oxidizing or reducing reaction, an ion concentration gradient is produced between the two electrolyte portions separated by the separating film. More specifically, as a reducing reaction proceeds, anions are released into one electrolyte, thus increasing the anion concentration in one of the separated electrolyte portions, or when the dopant in the conducting polymer is a polymer, cations in electrolyte are doped, thus reducing the cation concentration in one of the separated electrolyte portions.

In consequence, ions in the other separated electrolyte portion, in which the reference electrode is disposed, are caused by the ion concentration gradient to move toward the vicinity of the separating film, thus causing potential variations of the reference electrode. Since the potential control means serves to maintain a constant potential difference between the reference electrode and the working electrode, the potential variations of the reference electrode cause corresponding variations of the working electrode potential. The reducing reaction thus further proceeds between the counter electrode and the working electrode, thus causing further current flow between these electrodes. On the other hand, in an oxidizing reaction which is opposite in polarity to the reducing reaction, opposite current is caused to flow between the counter electrode and the working electrode.

As the conducting polymer undergoes the above oxidizing and reducing reactions repeatedly, an oscillating current is produced between the counter electrode and the working electrode. This oscillation is continued semi-permanently so long as the potential control means continues to provide control. The electrolyte may be liquid electrolyte or solid electrolyte.
(Non-linear Oscillator Using Entrainment)

A non-linear oscillator according to a second aspect of the invention features that in the non-linear oscillator according to the first aspect of the invention noted above, a plurality of conducting polymer films are formed under different conditions on the working electrode. A different embodiment of the non-linear oscillator according to the second aspect of the invention features that a plurality of non-linear oscillators according to the first aspect of the invention are formed together as a group such that the individual non-linear oscillators are electrically connected together, in that the electrolytes with the counter electrodes dipped therein are connected together electron-wise or ion-wise, and that each of the non-linear oscillators has a conducting polymer film formed under different conditions on the working electrode. The conducting polymer films formed under different conditions are, for instance, those doped with different dopants.

In the non-linear oscillator according to the second aspect of the invention, a plurality of conducting polymer films are formed such that a current is output from each of them. The amplitude and period of oscillation obtainable with the non-linear oscillator according to the invention depends on the electrochemical character of the conducting polymer film. Thus, non-linear oscillations in different modes are obtainable with the plurality of conducting polymer films prepared under different conditions. The condition of preparation here is the condition of polymerization or preparation of conducting polymer, and it may be the type and concentration of monomer, type and concentration of supporting electrolyte, type of solvent, electrolysis condition (such as electrolytic current density), copolymerizing condition (such as introduction of protein or the like at the time of the polymerization) and condition of substitution of substitute ions for the dopant in an electrolytic process after the polymerization of the conducting polymer (such as the type and concentration of the supporting electrolyte, type of solvent, electrolysis condition, etc.). Among these preparing conditions, the amplitude and period of oscillation in particular are changed greatly with change in the type of dopant. Thus, when it is desired to obtain a plurality of different modes of non-linear oscillation, it is very useful to form a plurality of conducting polymer films doped with different dopants.

Further, in the non-linear oscillator according to the second aspect of the invention in which a plurality of conducting polymer films are formed under different conditions on the working electrode, an interaction (i.e., an entrainment phenomenon in which a plurality of oscillators begin to oscillate with the same period under a certain condition) is produced among the conducting polymer films. This also takes place in the non-linear oscillator in which a plurality of non-linear oscillators are electrically connected to one another. This entrainment phenomenon changes the waveform obtainable from the non-linear oscillator. From a different viewpoint, it can be regarded that the individual oscillators compare themselves, thus effecting a primitive treatment. Thus, when the phenomenon is applied to a sensor to be described later, a substance can be readily identified as such through analysis of a pattern produced as a result of the entrainment.

In the non-linear oscillator as described above, the conducting polymer which is capable of electrochemical oxidation and reduction, may be polypyrrole or derivatives thereof. Polypyrrole and derivatives thereof are typical conducting polymers capable of electrochemical oxidation and reduction, and they feature that they are electrochemically active in aqueous solution and there are many different dopants that are applicable to them. They are thus suitable as conducting polymer.

(Sensor Using Non-Linear Oscillator)

The sensor according to the invention is used as a chemical sensor by monitoring the output current waveform basically by making use of the fact that the waveform of oscillation of the non-linear oscillator according to the invention depends on a substance contained in the electrolyte.

(Sensitivity of Non-Linear Oscillator)

When a certain substance is added to the electrolyte of the non-linear oscillator according to the first aspect of the invention, the oscillation characteristics may be varied. When the oscillation characteristics of a non-linear oscillator set under certain conditions are varied by adding a certain substance to the electrolyte in the oscillator, this is defined according to the invention such that the substance has a "stimulating property" with respect to a certain non-linear oscillator. Of course, there are substances which have no "stimulating property" with respect to a non-linear oscillator set under certain conditions, and adding such a substance to the electrolyte produces no oscillation characteristic variation before and after the addition. Considering the "stimulating property" from the substance side, the non-linear oscillator is regarded to be "sensitive" to a substance having a "stimulating property" and "insensitive" to a substance having no "stimulating property". Whether or not the non-linear oscillator is sensitive to a certain substance depends on such conditions as the type of conducting polymer film, type, concentration and temperature of electrolyte, kind of electrodes, etc.

(Sensor Structure)

A first sensor according to the invention uses the non-linear oscillator according to the first aspect of the invention and makes direct use of sensitivity of the non-linear oscillator described above. Specifically, the first sensor comprises a non-linear oscillator according to the first aspect of the invention and processing means for processing a signal obtained from the non-linear oscillator, and it features that it can detect the presence of a substance in the electrolyte by detecting a change in oscillating current output from the processing or output means.

With such a first sensor, dissolution of a stimulant substance in the electrolyte causes a change in the oscillating current output from the output means, and the presence of a substance in the electrolyte can be detected through detection of the change. It is thus possible to determine whether the sensor has touched a predetermined substance. If the range of the "predetermined substance" is narrow, it means that the first sensor can identify the substance. For example, if the non-linear oscillator according to the first aspect of the invention is sensitive to alcohol only, it can be used as an alcohol sensor. Conversely, the first sensor may be made to be sensitive to a specific substance by appropriately setting such conditions as the type, concentration or temperature of electrolyte, type of electrodes, type of conducting polymer film, etc.

In the meantime, when a certain stimulant substance is dissolved in the electrolyte, the waveform of the oscillating current is varied in dependence on the type of dissolved substance. A second sensor can determine the type of a substance in the electrolyte through detection of the waveform of the oscillating current output from the output means. A third sensor is one step ahead of the second sensor, and can identify an odor or a taste through detection of a change in the oscillating current and the waveform thereof. Specifically, the second sensor comprises a non-linear oscillator according to the invention and processing means for processing a signal from the non-linear oscillator, and it features that it can determine the type of substance in the electrolyte through detection of the waveform of oscillating current output from the processing or output means. The third sensor comprises a non-linear oscillator according to the invention and processing means for processing a signal obtained from the non-linear oscillator, and it features that it can identify an odor or a taste through detection of a change in the oscillating current output from the processing or output means or the waveform thereof. When the non-linear oscillator used is according to the second aspect of the invention, the interaction (or entrainment phenomenon) described above allows ready identification of the substance, odor or taste (Sensor Utilizing Entrainment Phenomenon)

A fourth sensor according to the invention comprises a non-linear oscillator according to the second aspect of the invention and processing means for processing a signal obtained from the non-linear oscillator, and it features that it can determine the type, odor or taste of a substance in the electrolyte through detection of a change in the oscillating current output from the processing or output means.

The determination of the type, odor or taste of a substance by the fourth sensor will now be described with reference to FIGS. 1(A), 1(B), and 1(C). A case as shown in FIG. 1(A) is considered, in which three non-linear oscillators (1) to (3) are used, the oscillator (1) being sensitive to substances A and B, the oscillator (2) being sensitive to the substance B, the oscillator (3) being sensitive to the substance A and also to a substance C. By connecting together the non-linear oscillators (1) to (3) (one oscillator may have a plurality of conducting polymer films formed under different conditions on the working electrode), interaction (i.e., entrainment phenomenon) is produced among the oscillators (1) to (3) so that new waveforms are generated (as shown in FIG. 1(B)). When a substance X as the subject under test is added to the system, the new waveforms are changed. For example, when the substance A is added as the substance X, it is active to the oscillators (1) and (3) but is not active to the oscillator (2). When the substance B is the substance X, it is stimulant to the oscillators (1) and (2). When the substance C is the substance X, the oscillators (1) and (2) are insensitive to this substance. However, these substances all affect the interaction (or entrainment phenomenon) among the oscillators (1) to (3), and they affect the interaction differently to generate different waveforms such as shown in (a) in FIG. 1(C) when the substance A is added to the system, in (b) when the substance B is added, and in (c) when the substance C is added. Thus, when the fourth sensor touches a certain substance in the electrolyte, the type, odor or taste of the substance can be determined through detection of a change in the oscillating current obtained from the non-linear oscillator according to the second aspect of the invention.

BRIEF DESCRIPTION OF THE DRAWINGS

FIGS. 1(A), 1(B), and 1(C) are views for describing the principles underlying a sensor making use of the entrainment phenomenon;

DETAILED DESCRIPTION OF THE PREFERRED EMBODIMENTS

An embodiment of the invention will now be described with reference to the drawings in connection with a case in which polypyrrole is used as conducting polymer and a liquid electrolyte is used as electrolyte.

Figure 2:
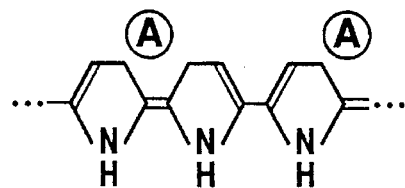
FIG. 2 is a view showing t e chemical structure of polypyrrole.

Polypyrrole is a film obtained through electro-polymerization of pyrrole as a monomer. FIG. 2 shows the structure of polypyrrole. As shown, anions (A) in the electrolyte are incorporated into polypyrrole as dopant, the anions (A) thus incorporated into determining the physical character of the film. In polypyrrole, unpaired electrons are present in the steady state, so that polypyrrole is electrically conductive in the stable state.

Figure 3:
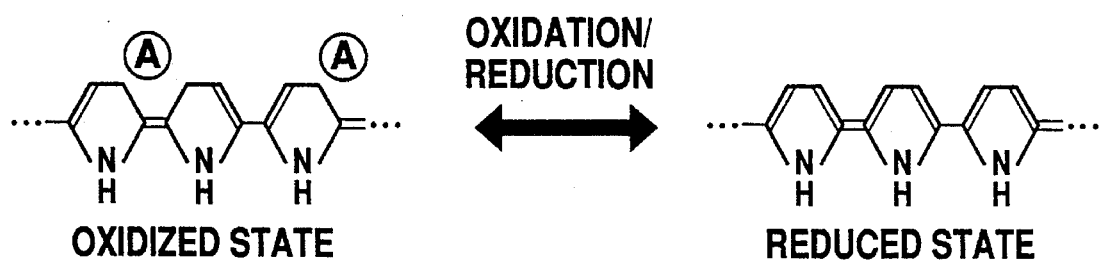
FIG. 3 is a view for describing oxidizing and reducing reactions of polypyrrole.

FIG. 3 shows oxidizing and reducing reactions of polypyrrole. In its oxidized state, polypyrrole is conductive. When it is reduced, it becomes insulating because of the release of anions from it into the liquid electrolyte. In a case when the dopant is a polymer, the polypyrrole chain grows by being firmly attracted to polymer anions. Thus, even when polypyrrole is reduced, anions are not released but remain in the electropolymerized film, so that cations in the liquid electrolyte are incorporated in lieu of the release of anions.

Figure 4:
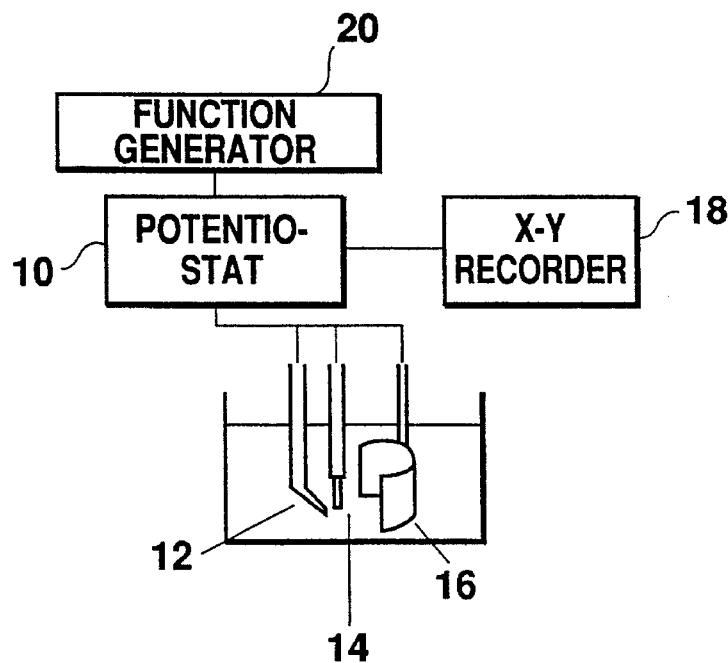
FIG. 4 is a schematic showing an electrochemical measuring system using a potentiostat.
Figure 5:
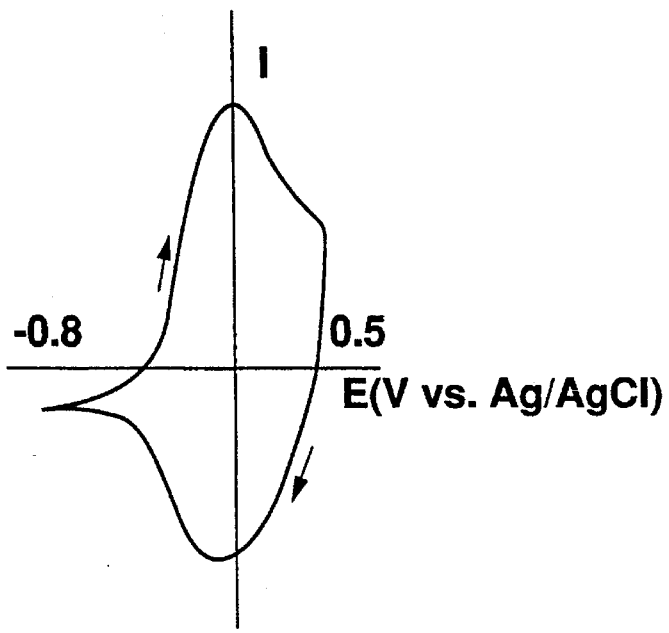
FIG. 5 is a cyclic voltammogram of polypyrrole.

FIG. 4 shows a typical system structure for measuring an electrochemical characteristic of polypyrrole. FIG. 5 shows a cyclic voltammogram of polypyrrole that is obtained with the measuring system shown in FIG. 4. Referring to FIG. 4, the system comprises a potentiostat 10, which serves to maintain the potential on the working electrode 14 at a predetermined potential with respect to the reference electrode 12, irrespective of changes in the status of the electrolytic system. Generally, the potentiostat 10 includes an operational amplifier, a potential-setting power supply, a resistor and an electrolytic trough as part of a feedback loop, and it always holds a predetermined potential irrespective of the magnitude of current flowing between the working electrode 14 and counter electrode 16. When a cycle potential is swept between the working electrode 14 and the reference electrode 12, a current as shown in FIG. 5 is caused to flow between the working electrode 14 and the counter electrode 16. The supporting electrolyte may be $KNO_3$ or NaCl. As is seen from the Figure, with the potential sweep polypyrrole undergoes oxidizing and reducing reactions, and a peak is shown particularly at 0 V vs. Ag/AgCl.

Figure 6:
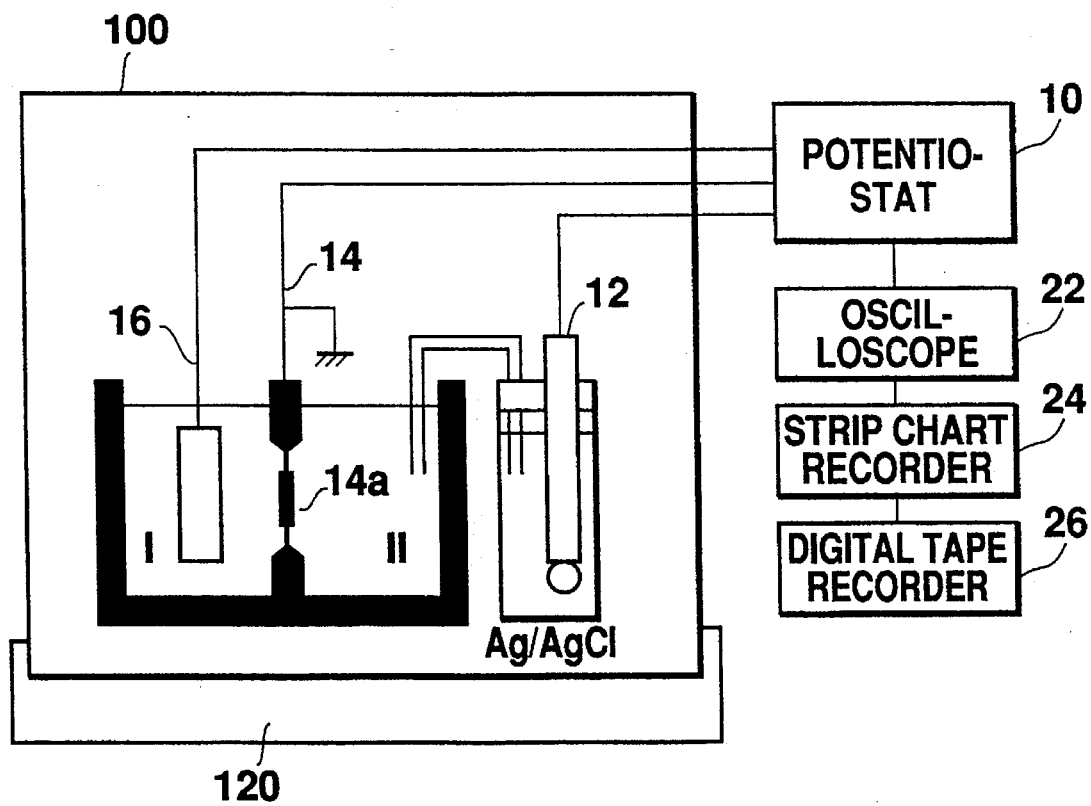
FIG. 6 is a schematic showing an embodiment of the invention.

FIG. 6 shows an embodiment of the non-linear oscillator according to the invention. The non-linear oscillator according to the invention has a structure which is similar to the structure of the electrochemical measuring system using the potentiostat 10 as shown in FIG. 4, but it has the following features.

(1) The reference electrode 12, working electrode 14 and counter electrode 16 are not found in the same liquid electrolyte, but the working electrode 14 separates the liquid electrolyte with the reference electrode 12 therein and the liquid electrolyte with the counter electrode therein from each other.

Figure 7:
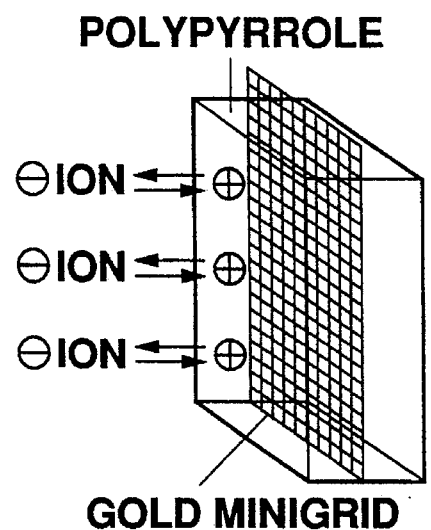
FIG. 7 is a view for describing the structure of a working electrode.

(2) The working electrode 14 has a separating film part 14a of polypyrrole (with polyvinyl sulfate ions or the like as dopant) formed by electropolymerization on a grid- or lattice-like electrode of gold or platinum (or of carbon or graphite) (FIG. 7). This separating film part 14a separates the two liquid electrolyte parts from each other.

(3) The working electrode 14 is held by the potentiostat 10 to be at a potential intermediate between the oxidizing and reducing potentials of polypyrrole, i.e., 0 V vs. Ag/AgCl (the potential varying with the type of dopant).

The liquid electrolyte may be an aqueous solution of KCl or the like. The oscillator system as a whole is shielded in a box 100, which rests on a vibration-proof support 120. The current between the working electrode 14 and the counter electrode 16 is supplied to an oscilloscope 22, a strip chart recorder 24 and a digital tape recorder 26 for recording changes in current with time. The box 100 and vibration-proof support 120 may be dispensed with if there is no external noise influence.

The conducting polymer film is not limited to polypyrrole film, and it is possible to use polypyrrole derivatives based on pyrrole derivatives as monomer, or thiophene and derivatives thereof. Further, it is possible to use not only polypyrrole or similar heterocyclic 5-membered ring conducting polymer but also polyaniline or like heterocyclic 6-membered ring conducting polymer.

Further, the electrolyte as claimed in the claims is not limited to liquid electrolyte, but it is possible to use such (polymer) solid electrolyte as hydrous gel or polyethylene oxide as well. In view of the form of the sensor device or similar element, it will be more effective to use a solid electrolyte such as hydrous gel.

Now, changes that take place at the working electrode 14 or the reference electrode 12 of the non-linear oscillator embodying the invention will be described in detail. In order to facilitate the description, the liquid electrolyte between the working electrode 14 and the counter electrode 16 is referred to as liquid electrolyte I, and the liquid electrolyte between the working electrode 14 and the reference electrode 12 is referred to as liquid electrolyte II.

When the working electrode 14 is set to 0 V, i.e., a potential intermediate between the oxidizing and reducing potentials of polypyrrole, an oxidizing or reducing reaction is brought about in the separating film part 14a of the working electrode 14. When a reducing reaction is brought about, anions as dopant are intrinsically released from polypyrrole as the separating film 14a of the working electrode 14. However, when ions of polyvinyl sulfate, which is a polymer, constitutes a dopant, they are not released. Instead, polypyrrole takes in $K^+$ ions that are cations in the liquid electrolyte as dopant, to make up for the charge of residual anions. As a result, the $K^+$ ion concentration in the liquid electrolyte I is reduced.

However, polypyrrole has ion selectivity, that is, in this case it allows only $K^+$ ions to pass through it. Therefore, with the progress of the reducing reaction the $K^+$ ion concentration in the liquid electrolyte I continues to be reduced, thus producing a $K^+$ ion concentration gradient between the liquid electrolytes I and II. With this ion concentration gradient, the $K^+$ ions in the liquid electrolyte II tend to pass through the separating film 14a of polyprrole. As a reaction to this tendency, negative charge is generated on the film surface in the liquid electrolyte II, thus reducing the potential on the reference electrode 12. With the reduction of the potential on the reference electrode 12, the potential on the working electrode 14 is also reduced by the potentiostat 10, which functions to maintain a constant potential difference between the working electrode 14 and the reference electrode 12. If the potential on the reference electrode 12 and the working electrode 14 is fixed, after the lapse of a predetermined period of time the reducing reaction is ended so that no further current is caused to flow between the working electrode 14 and the counter electrode 16. In this embodiment of the invention, however, the potential on the working electrode 14 is reduced along with the potential on the reference electrode 12, so that a further reducing reaction causes further current between the working electrode 14 and the counter electrode 16.

When the reducing reaction at the working electrode 14 is ended after the lapse of a predeteremined period of time, energy that causes the oxidizing reaction now surpasses at the polypyrrole separating film 14a, thus causing a reverse current to flow between the working electrode 14 and the counter electrode 16 and releasing $K^+$ ions that have been taken in as cations. As a result, the $K^+$ ion concentration in the liquid electrolyte I is increased to reduce the ion concentration gradient between the liquid electrolytes I and II and increase the potential on the reference electrode 12. With the increase of the reference electrode 12 the potential on the working electrode 14 is also increased by the potentiostat 10. When this state is brought about, the potential on the working electrode 14 is increased by the action of the potentiostat under principles converse to those described above, so that the oxidizing reaction further proceeds to cause further current between the working electrode 14 and the counter electrode 16.

As the polypyrrole separating film 14a undergoes the above oxidizing and reducing reactions repeatedly, opposite currents are caused to flow alternately between the working electrode 14 and the counter electrode 16. Consequently, an osicllating current is recorded in the oscilloscope 22 or in the recorder 24 or 26.

EXAMPLE

Now, an example of the invention will be described.

As the working electrode 14, as shown in FIG. 7, a polypyrrole film doped with polyvinyl sulfate ions was formed on a gold 1,000-mesh mini-grid electrode secured to a support plate and provided with platinum wire leads. When forming the gold-polypyrrole film, electrolysis was carried out as constant current electrolysis of 2.5 mA/cm² in an aqueous solution containing 0.1M of polypyrrole and 0.1M of potassium polyvinyl sulfate. The amount of electrolysis at this time was 10 C/cm².

The working electrode 14 that was prepared in this way was disposed between two Teflon cells which were filled with an aqueous solution containing 0.1M of supporting electrolyte, and an electrode arrangement as shown in FIG. 6 was prepared (with the counter electrode and reference electrode disposed in the separate cells). Then, a current that was caused by applying a potential between the oxidizing and reducing potentials of the polypyrrole film was measured. In this example, an Ag/AgCl electrode was used as the reference electrode 12, and the working electrode 14 was set to 0 V with respect to the Ag/AgCl electrode. As the liquid electrode, an aqueous solution containing 0.1M of KCl was used.

Figure 8:
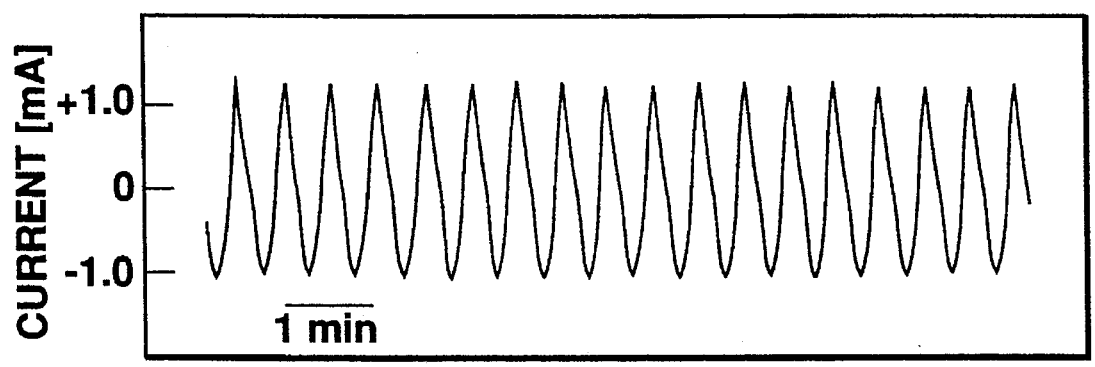
FIG. 8 is a graph showing the output current plotted against time of the same embodiment.

FIG. 8 shows the result of recording time changes in current between the working electrode 14 and the counter electrode 16 obtained with the system structure as described. It will be seen that a stable oscillating current could be obtained with an amplitude of about 2.0 mA and a period of about 30 sec. Such oscillating phenomena could be observed for 5 hours or more. This means a success in realizing a stable current oscillation based on the alternate oxidizing and reducing reactions of the polypyrrole film.

Figure 9:
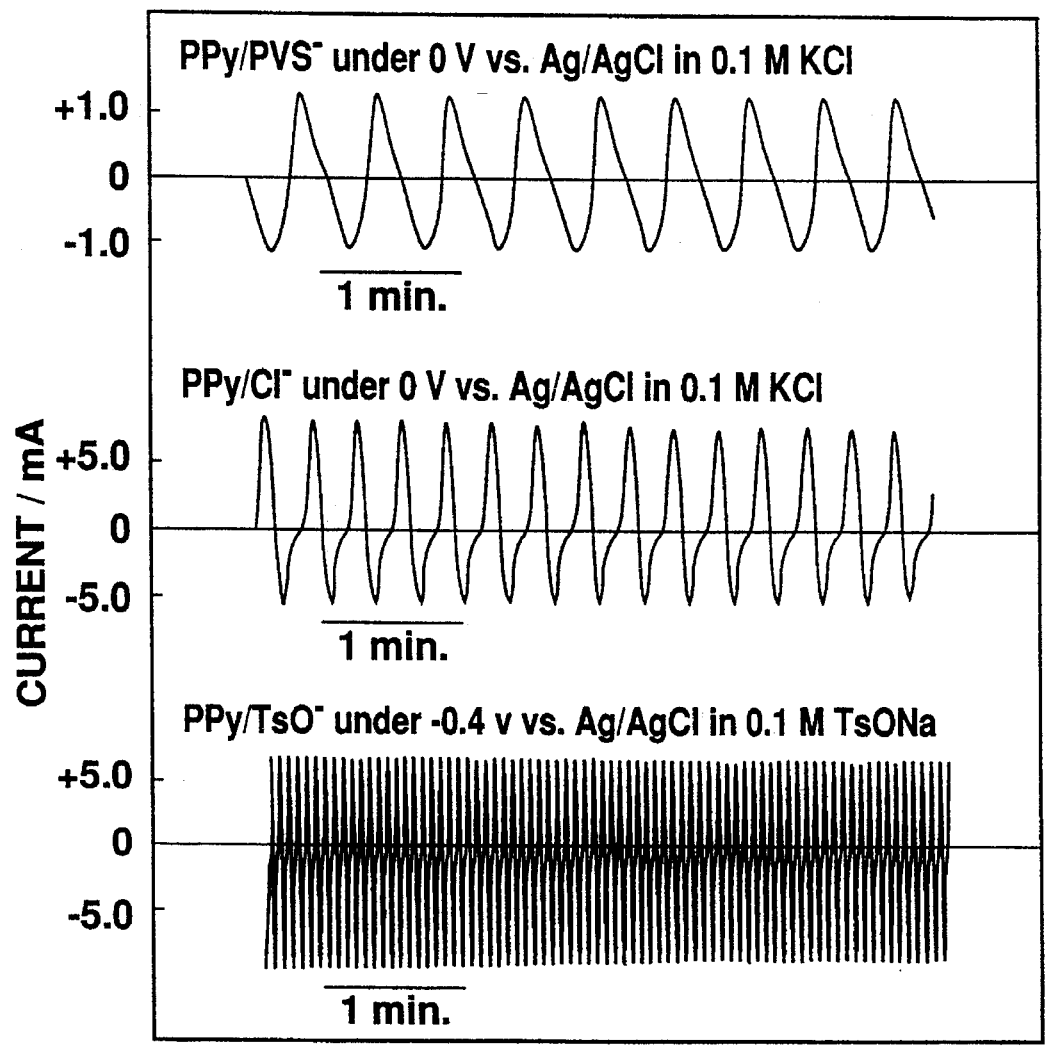
FIG. 9 is a graph showing changes in oscillating current obtained when the dopant changes.

This current oscillation is obtained as current changes (or oscillations) by applying 0 V vs. Ag/AgCl on the polypyrrole film doped with polyvinyl sulfate ions, and it may be greatly influenced by the dopant anions (i.e., film structure) in the film preparation. Actually, it was made clear that various different types of oscillation waveform are obtainable by varying the type of dopant anion in polypyrrole film preparation as shown in FIG. 9. This means that waveform control is obtainable with the dopant anion type and further that the polypyrrole film structure can be evaluated from the waveform.

(Applications to Sensors)

The amplitude and period of the oscillation as described above vary greatly in dependence on the character of the polypyrrole film 14a and also on the type of electrolyte. Further, the oscillation waveform is varied greatly by the intrusion of foreign matter in the liquid electrolyte. Thus, the system shown in FIG. 6 can be utilized as an odor or taste sensor for specifying a substance introduced into the liquid electrolyte by having the waveform of the oscilloscope 22 or the digital tape recorder 26 checked in advance and detecting waveform changes.

Tests were conducted on odor and taste sensors on an oscillation basis by using the present oscillator. First, a salt concentration effect was examined by using an electric oscillating system obtainable with a polypyrrole film doped with chloride ions (Cl⁻). In this test, the working electrode 14a was prepared by constant current electrolysis of 2.5 mA/cm² (with an electrolysis amount of 10 C/cm²) using an aqueous solution containing 0.1M of polypyrrole and 0.1M of potassium chloride.

Figure 10:
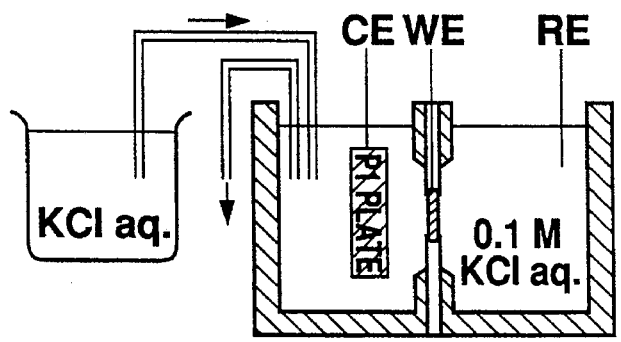
FIG. 10 is a schematic view showing the structure of a non-linear oscillator used to check the effect of salt concentration.
Figure 11:
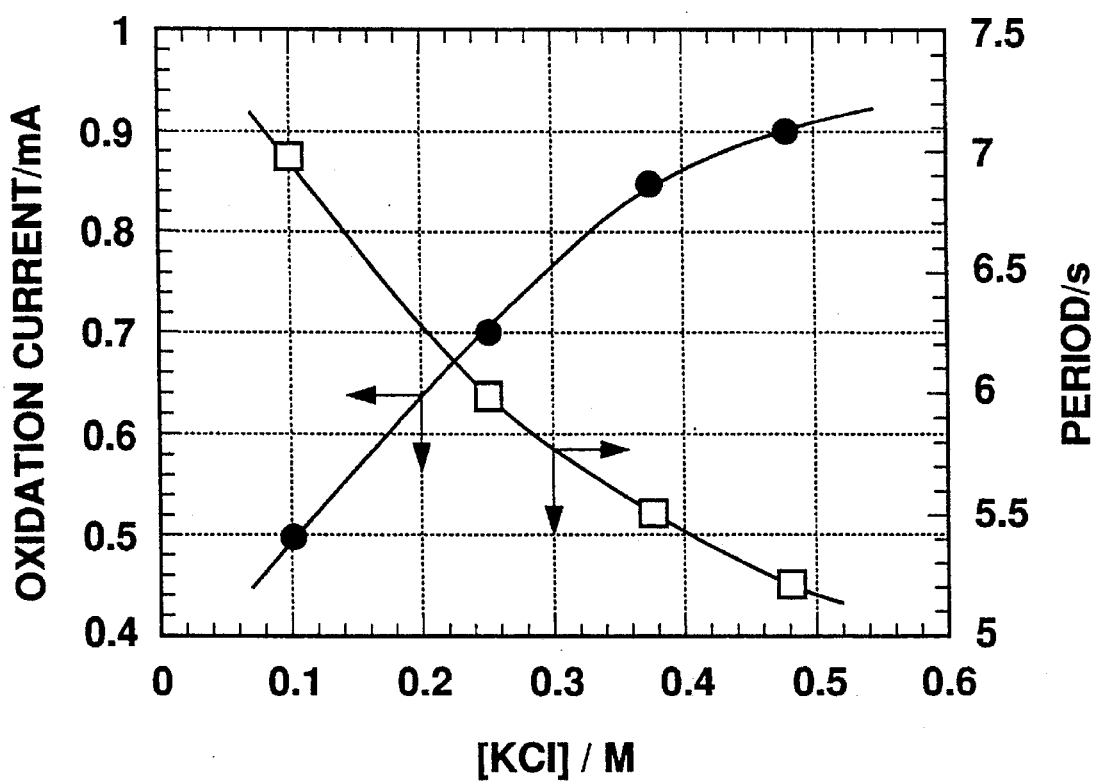
FIG. 11 is a graph showing results of checking the effect of salt concentration on a non-linear oscillator according to the invention by using the non-linear oscillator as shown in FIG. 10.

Using a system as shown in FIG. 10, tests were conducted by setting the potential on the working electrode 14 to 0.2 V with respect to the reference electrode 12 (i.e., Ag/AgCl electrode). It was made clear that increasing the salt concentration decreases the period and increases the amplitude (FIG. 11). This result was obtained with a single type of film, and it is thus predicted that by varying the composition of the film, etc. a unique response to a substance is obtainable in correspondence to the film structure. A possibility is thus suggested that permits obtaining novel oscillation-based sensing which expresses different substances with modulation of electric oscillation.

Figure 12A:
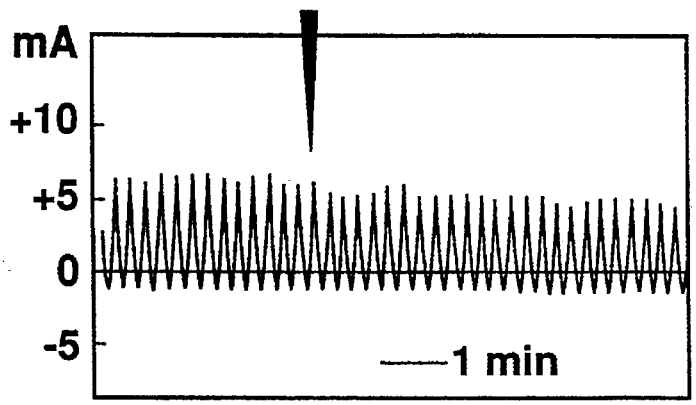
FIGS. 12(A), 12(B) and 12(C) are graphs showing changes in oscillating current obtained when chemical substances are added to the electrolyte of the non-linear oscillator as the embodiment of the invention, FIG. 12(A) being a graph obtained when a bitter substance is added, FIG. 12(B) being a graph when a sour substance is added, and FIG. 12(C) being a graph when a sweet substance is added.
Figure 12B:
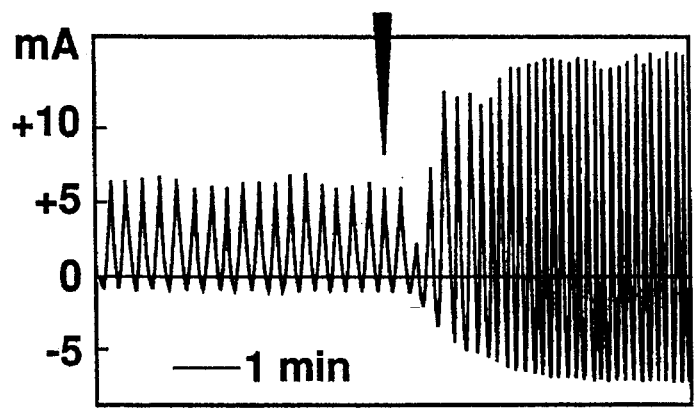
Figure 12C:
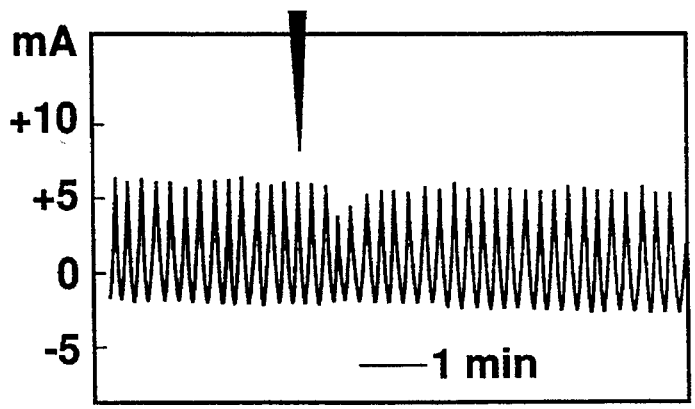

To verify this possibility, sensing was actually conducted in cases when quinidine sulfate, hydrochloric acid and fructose were added to the liquid electrolyte by using an electrical oscillation system with a polypyrrole film doped with chloride ions (Cl⁻) (prepared under conditions described above). The testing was conducted with an aqueous solution containing 0.1M of KCl and setting 0 V on the working electrode 14 with respect to the reference electrode 12 (i.e., Ag/AgCl electrode). With the three different substances noted above, obviously different waveforms were obtained as shown in FIGS. 12(A) to 12(C). Obviously, the non-linear oscillator according to the invention can be used as a sensing part of a sensor for identifying substances. In addition, since quinidine sulfate, hydrochloric acid and fructose correspond to bitterness, sourness and sweetness, respectively, the non-linear oscillator according to the invention obviously can be used as a sensing part of a sensor for identifying odor or taste.

The sensor may be produced by using the non-linear oscillator according to the invention as its sensing part, connecting the electrode output terminals thereof to a usual processing system and providing a mechanism of permitting a substance or odor or taste to be taken in the electrolyte. Since the sensor is centered on the non-linear oscillator according to the invention, a person having ordinary knowledge in the art can readily construct the sensor by adding other parts to the oscillator.

(Sensors Utilizing Entrainment Phenomenon)

The non-linear oscillator according to the invention allows formation of a plurality of conducting polymer films under different conditions on the working electrode and also electrical connection of a plurality of non-linear oscillators to one another.

Figure 13:
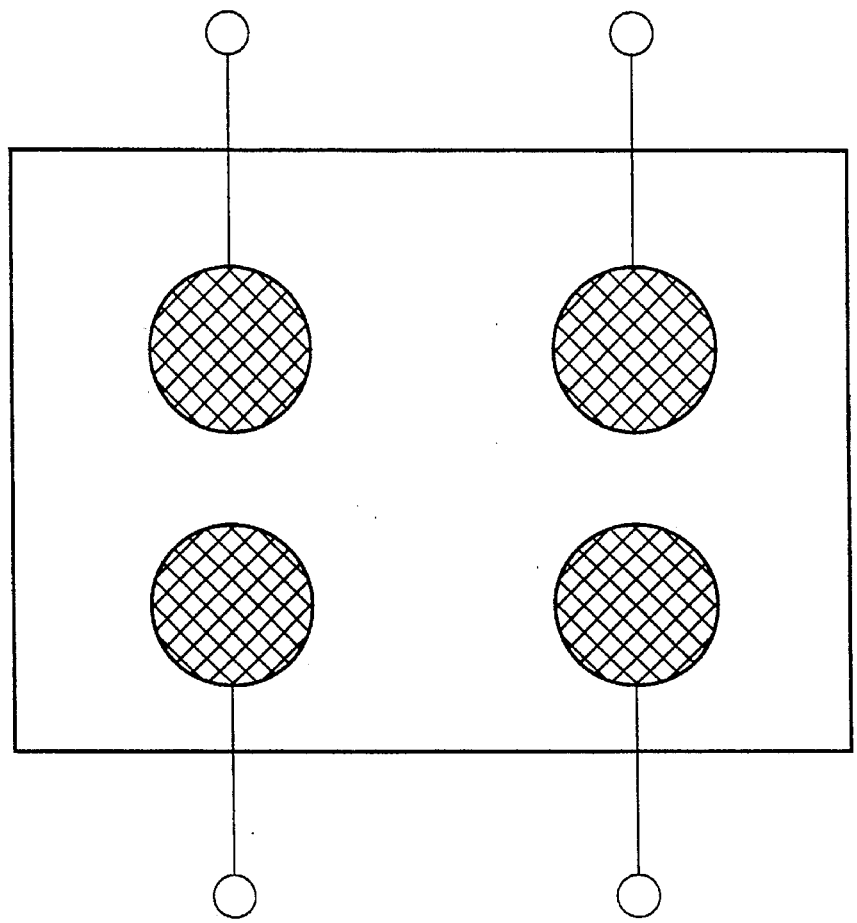
FIG. 13 is a view showing a different embodiment of the invention.
Figure 14:
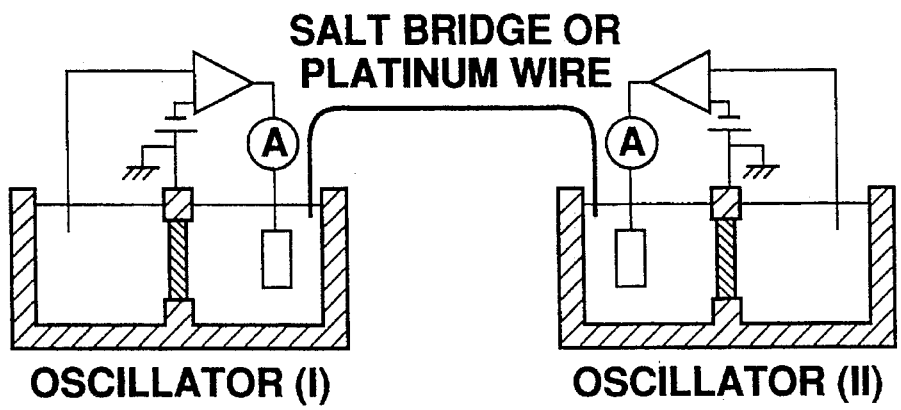
FIG. 14 is a view showing two non-linear oscillators electrically connected to each other.

For example, while in the above embodiment only a single film was formed as the polypyrrole film 14a on the working electrode 14, it is also possible to form a plurality of polypyrrole films which are different in material and conditions of preparation on the working electrode 14 so as to permit detection of oscillating currents through the respective films. FIG. 13 schematically shows an example in which a plurality of polypyrrole films are formed. FIG. 14 shows an arrangement in which two non-linear oscillators are electrically connected to each other.

In the case of either FIG. 13 or 14, the individual polypyrrole films are different in the conditions of their preparation. In addition, their oscillating currents are different in amplitude and period, and further, the extent of the change in current when a foreign matter is introduced into the liquid electrolyte varies. Thus, through overall detection of the changes in oscillating currents in the individual polypyrrole films it is possible to identify a substance present in the liquid electrolyte and to carry out quantitative detection of the concentration of the substance, as described before with reference to the drawings.

At any rate, whether this type of non-linear oscillator can serve as a sensor depends on the interaction that takes place among the conducting polymer films (i.e., entrainment phenomenon where a plurality of oscillators begin to oscillate with the same period under a certain condition). In other words, it is predicted that by forming a plurality of oscillators with a plurality of polypyrrole films, an oscillatory entrainment phenomenon can be brought about which is observed extensively in biological and other fields. It is thus possible to expect extensive applications not only to sensors but also to other purposes. It is thus very important whether the entrainment phenomenon can actually be brought about by connecting together a plurality of oscillators.

The inventors studied the interaction among oscillators as dynamics that are peculiar to non-linear oscillators by using a non-linear oscillator as shown in FIG. 14. In this instance, the working electrode was prepared by constant current electrolysis (electrolysis amount: 10 C/cm$^2$) with 2.5 mA/cm$^2$ using an aqueous solution containing 0.1M of pyrrole and 0.1M of potassium chloride, and it was set to 0 V with respect to the reference electrode (i.e., Ag/AgCl electrode). The concentration of the KCl aqueous solution in the cells was set to 0.1M.

Figure 15A:
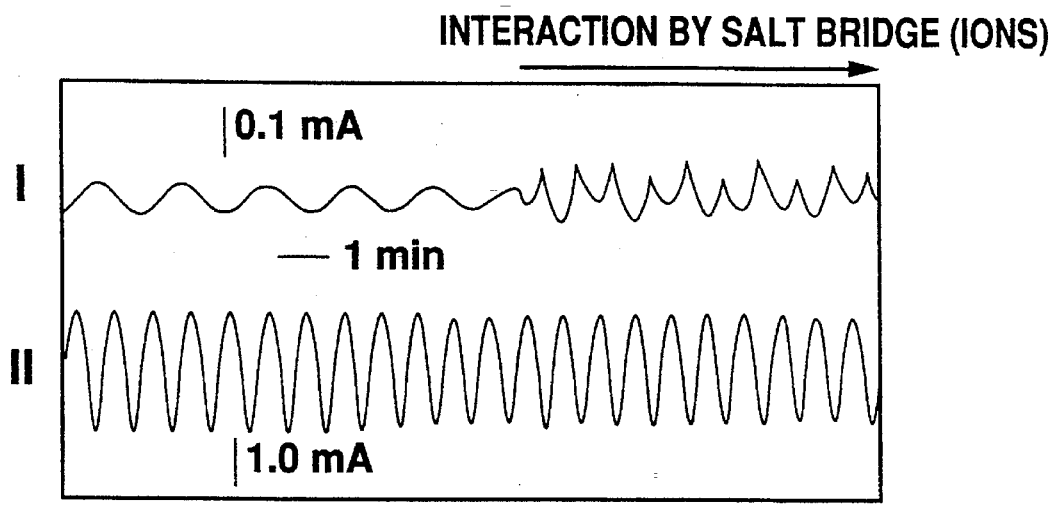
FIGS. 15(A) and 15(B) are graphs showing entrainment phenomenon taking place between two non-linear oscillators, FIG. 15(A) being a graph obtained in a case when the two non-linear oscillators are connected by salt bridge, FIG. 15(B) being a graph obtained in a case when the two non-linear oscillators are connected with a platinum wire.
Figure 15B:
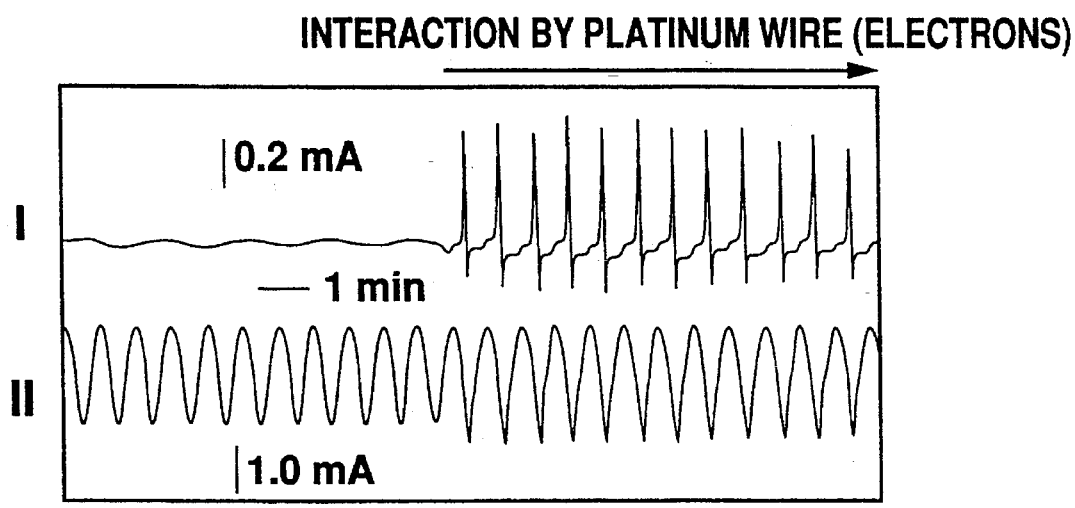

In consequence, as shown in FIGS. 15(A) and 15(B), different entrainment phenomena with different interaction types (ions and electrons) could be verified. FIG. 15(A) shows interaction obtained in a case when two oscillators were connected together by a salt bridge. FIG. 15(B) shows interaction obtained in case when the oscillators were connected with a platinum wire. In case of using the salt bridge, interaction based on ions can be expected, while in the case of the platinum wire it is possible to expect interaction based on electrons. In either case, it is seen that the period is synchronized after connection of the oscillators.

As shown above, since the phenomenon of entrainment takes place among a plurality of oscillators, by constructing a system, in which a plurality of polypyrrole film type non-linear oscillators having different film characteristics are caused to interact with one another, it is possible to obtain a system for measuring modulation of oscillation by an odor or taste substance and recognizing the substance with an oscillation pattern.

As has been described in the foregoing, with the non-linear oscillator according to the invention a film of polypyrrole or like conducting polymer capable of electrochemical oxidation and reduction can realize stable and semipermanent current oscillation by merely applying a constant potential to it. Further, this non-linear oscillator permits control of the waveform, such as oscillation frequency, by varying the film composition.

Further, a sensor using such a non-linear oscillator according to the invention permits identification of substances through modulation of electrical oscillation. The invention is thus applicable to chemical sensors and the like. Further, by making use of waveform modulation patterns it is possible to obtain comparatively convenient recognition of such complicated information as odor or taste, which has been difficult with prior art techniques.

What is claimed is:

1. A non-linear oscillator comprising:

a working electrode provided with a conducting polymer film separating an electrolyte and capable of being electrochemically oxidized and reduced;

a counter electrode provided for and electrically connected with one of the separated portions of the electrolyte;

a reference electrode provided for and electrically connected with the other separated portion of the electrolyte;

voltage control means for holding a constant potential difference between the reference electrode and the working electrode; and output means for outputting a current flowing between the counter electrode and the working electrode, wherein the potential on the working electrode is set to an intermediate value between the oxidizing and reducing potentials of the conducting polymer.

2. The non-linear oscillator according to claim 1, wherein a plurality of conducting polymer films are formed under different conditions on the working electrode.

3. A non-linear oscillator comprising a plurality of non-linear oscillators according to claim 1 formed together as a group, wherein in the group of non-linear oscillators:

the individual non-linear oscillators are electrically connected to one another through electron-wise or ion-wise connection of their separated electrolyte portions with the counter electrodes provided therein; and the individual non-linear oscillators each have a conducting polymer film formed under different conditions on the working electrode.

4. The non-linear oscillator according to claim 2, wherein the plurality of conducting polymer films formed under different conditions are doped with different dopants.

5. The non-linear oscillator according to claim 3, wherein the plurality of conducting polymer films formed under different conditions are doped with different dopants.

6. The non-linear oscillator according to claim 1, wherein:

the conducting polymer capable of being electrochemically oxidized and reduced is polypyrrole or a derivative thereof.

7. A sensor comprising the non-linear oscillator according to claim 1 and processing means for processing a signal obtained from the non-linear oscillator, the presence of a substance in the electrolyte being detected through detection of a change in oscillating current output from the processing means.

8. A sensor comprising the non-linear oscillator according to claim 2 and processing means for processing a signal obtained from the non-linear oscillator, the type, odor or taste of a substance present in the electrolyte being detected through detection of a change in oscillating current output from the processing means.

9. A sensor comprising the non-linear oscillator according to claim 1 and processing means for processing a signal obtained from the non-linear oscillator, the type of substance present in the electrolyte being detected through detection of the waveform of oscillating current output from the processing means.

10. A sensor comprising the non-linear oscillator according to claim 1 and processing means for processing a signal obtained from the non-linear oscillator, odor or taste being detected through detection of a change in and the waveform of oscillating current output from the processing means.

11. The non-linear oscillator as defined in claim 1, wherein the counter electrode is provided in the one of the separated portions of the electrolyte and the reference electrode is electrically connected to the other separated portion of the electrolyte by at least one of a metal wire and a salt bridge.

12. The non-linear oscillator as defined in claim 11, wherein the reference electrode is an Ag/AgCl electrode.

* * * * *